(12) United States Patent
Tsai et al.

(10) Patent No.: US 9,543,370 B2
(45) Date of Patent: Jan. 10, 2017

(54) SILICON AND SEMICONDUCTING OXIDE THIN-FILM TRANSISTOR DISPLAYS

(71) Applicant: Apple Inc., Cupertino, CA (US)

(72) Inventors: Tsung-Ting Tsai, Taipei (TW); Vasudha Gupta, Cupertino, CA (US); Chin-Wei Lin, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/494,931

(22) Filed: Sep. 24, 2014

(65) Prior Publication Data

US 2016/0087022 A1    Mar. 24, 2016

(51) Int. Cl.
| | |
|---|---|
| *H01L 27/32* | (2006.01) |
| *H01L 29/786* | (2006.01) |
| *H01L 51/00* | (2006.01) |

(52) U.S. Cl.
CPC ....... *H01L 27/3276* (2013.01); *H01L 27/3258* (2013.01); *H01L 27/3262* (2013.01); *H01L 27/3265* (2013.01); *H01L 29/7869* (2013.01); *H01L 29/78651* (2013.01); *H01L 51/0097* (2013.01); *H01L 2251/5338* (2013.01)

(58) Field of Classification Search
CPC .................................................. H01L 27/3276
See application file for complete search history.

(56) References Cited

U.S. PATENT DOCUMENTS

| | | | |
|---|---|---|---|
| 7,737,631 B2 | 6/2010 | Uhlig et al. | |
| 9,129,927 B2 * | 9/2015 | Gupta | ................. H01L 27/3262 |
| 9,147,719 B2 * | 9/2015 | Kim | ...................... H01L 27/326 |
| 2005/0007316 A1 | 1/2005 | Akimoto et al. | |
| 2009/0244057 A1 | 10/2009 | Seto | |
| 2010/0134735 A1 * | 6/2010 | Nakamura | .......... H01L 31/1055 349/116 |

(Continued)

FOREIGN PATENT DOCUMENTS

| | | |
|---|---|---|
| CN | 103000632 | 3/2013 |
| CN | 103295962 | 9/2013 |

(Continued)

OTHER PUBLICATIONS

Byung Duk Yang et al., U.S. Appl. No. 13/837,311, filed Mar. 15, 2013.

*Primary Examiner* — Eugene Lee
(74) *Attorney, Agent, or Firm* — Treyz Law Group, P.C.; G. Victor Treyz; Zachary D. Hadd (57) ABSTRACT

An electronic device display may have an array of pixel circuits. Each pixel circuit may include an organic light-emitting diode and a drive transistor. Each drive transistor may be adjusted to control how much current flows through the organic light-emitting diode. Each pixel circuit may include one or more additional transistors such as switching transistors and a storage capacitor. Semiconducting oxide transistors and silicon transistors may be used in forming the transistors of the pixel circuits. The storage capacitors and the transistors may be formed using metal layers, semiconductor structures, and dielectric layers. Some of the layers may be removed along the edge of the display to facilitate bending. The dielectric layers may have a stepped profile that allows data lines in the array to be stepped down towards the surface of the substrate as the data lines extend into an inactive edge region.

16 Claims, 11 Drawing Sheets

(56) References Cited

U.S. PATENT DOCUMENTS

| | | | |
|---|---|---|---|
| 2010/0182223 A1* | 7/2010 | Choi | G09G 3/3233 345/76 |
| 2011/0199351 A1* | 8/2011 | Kurokawa | G09G 3/3648 345/207 |
| 2011/0304311 A1* | 12/2011 | Takahashi | H01L 27/1225 323/311 |
| 2012/0228596 A1* | 9/2012 | Fujita | H01L 27/3276 257/40 |
| 2013/0001564 A1* | 1/2013 | Choi | H01L 27/3276 257/59 |
| 2013/0021549 A1* | 1/2013 | Fujita | G02F 1/133617 349/41 |
| 2014/0049522 A1 | 2/2014 | Mathew et al. | |
| 2014/0138651 A1 | 5/2014 | Oh | |
| 2014/0152685 A1* | 6/2014 | Iwaki | G09G 3/2007 345/589 |
| 2014/0183491 A1 | 7/2014 | Shin et al. | |
| 2014/0217397 A1 | 8/2014 | Kwak et al. | |
| 2014/0231761 A1 | 8/2014 | Kim et al. | |
| 2014/0299884 A1 | 10/2014 | Park et al. | |
| 2015/0001483 A1* | 1/2015 | Namkung | H01L 27/3244 257/40 |
| 2015/0055051 A1* | 2/2015 | Osawa | H01L 27/1225 349/48 |

FOREIGN PATENT DOCUMENTS

| | | |
|---|---|---|
| EP | 1640765 | 9/2005 |
| JP | 2010224403 | 10/2010 |

\* cited by examiner

SILICON AND SEMICONDUCTING OXIDE THIN-FILM TRANSISTOR DISPLAYS

BACKGROUND

This relates generally to electronic devices and, more particularly, to electronic devices with displays that have thin-film transistors.

Electronic devices often include displays. For example, cellular telephones and portable computers include displays for presenting information to users.

Displays such as organic light-emitting diode displays have an array of pixels based on light-emitting diodes. In this type of display, each pixel includes a light-emitting diode and thin-film transistors for controlling application of a signal to the light-emitting diode.

If care is not taken, the thin-film transistor circuitry of a display may exhibit excessive transistor leakage current, insufficient transistor drive strength, poor area efficiency, hysteresis, non-uniformity, and other issues. It would therefore be desirable to be able to provide improved electronic device displays.

SUMMARY

An electronic device may include a display. The display may have pixels that form an active area. An inactive border area may extend along an edge portion of the active area. The pixels may be formed from an array of pixel circuits on a substrate. The substrate may be formed from a rigid material or may be formed from a flexible material that bends in the inactive area.

Each pixel circuit may include an organic light-emitting diode and a drive transistor coupled to that organic light-emitting diode. Each drive transistor may be adjusted to control how much current flows through the organic light-emitting diode to which it is coupled and how much light is therefore produced by that diode. Each pixel circuit may include one or more additional transistors such as switching transistors and may include a storage capacitor.

Semiconducting oxide transistors and silicon transistors may be used in forming the transistors of the pixel circuits. For example, semiconducting oxide transistors may be used as switching transistors and silicon transistors may be used as drive transistors. There may be a single drive transistor and one or more additional transistors per pixel circuit.

The storage capacitors and the transistors may be formed using metal layers, semiconductor structures, and dielectric layers. The dielectric layers may have a stepped profile that allows data lines in the array of pixel circuits to be gradually stepped down towards the surface of the substrate as the data lines extend into an inactive bent edge region of the display. Some or all of the dielectric layers may be removed in inactive edge region to facilitate bending.

DETAILED DESCRIPTION

Figure 1:
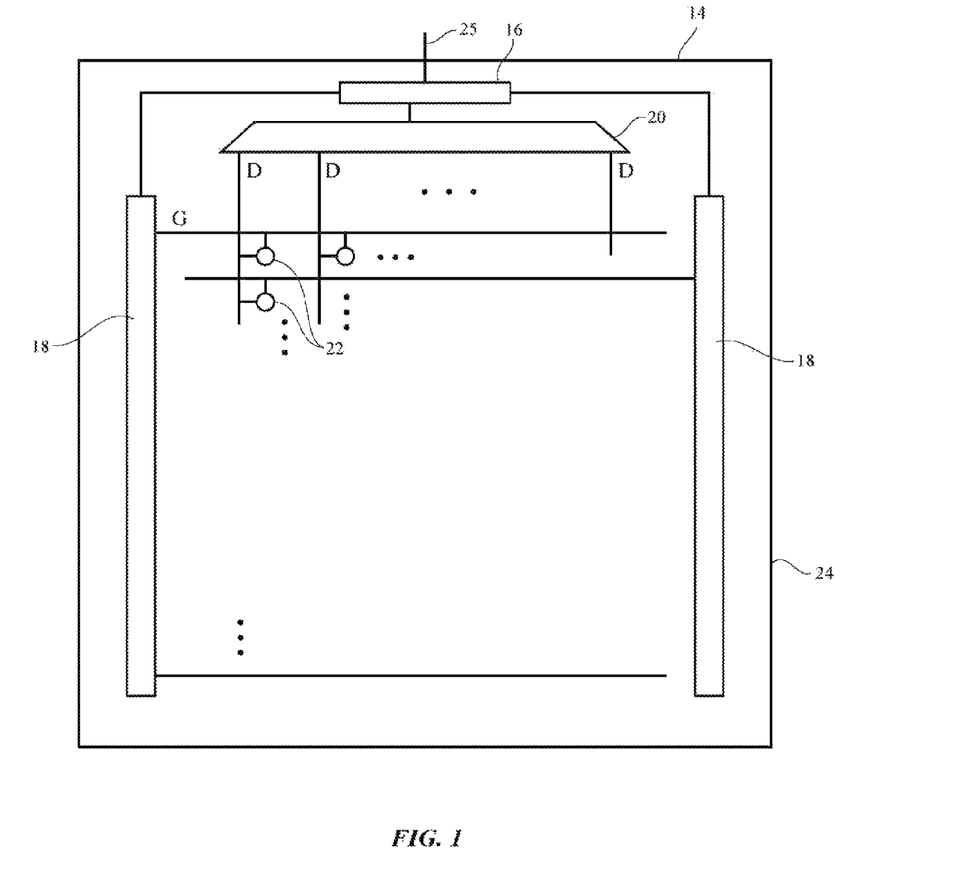
FIG. 1 is a diagram of an illustrative display such as an organic light-emitting diode display having an array of organic light-emitting diode pixels in accordance with an embodiment.

A display in an electronic device may be provided with driver circuitry for displaying images on an array of pixels. An illustrative display is shown in FIG. 1. As shown in FIG. 1, display 14 may have one or more layers such as substrate 24. Layers such as substrate 24 may be formed from insulating materials such as glass, plastic, ceramic, and/or other dielectrics. Substrate 24 may be rectangular or may have other shapes. Rigid substrate material (e.g., glass) or flexible substrate material (e.g., a flexible sheet of polymer such as a layer of polyimide or other materials) may be used in forming substrate 24.

Display 14 may have an array of pixels 22 (sometimes referred to as pixel circuits) for displaying images for a user.

The array of pixels 22 may be formed from rows and columns of pixel structures on substrate 24. There may be any suitable number of rows and columns in the array of pixels 22 (e.g., ten or more, one hundred or more, or one thousand or more).

Display driver circuitry such as display driver integrated circuit 16 may be coupled to conductive paths such as metal traces on substrate 24 using solder or conductive adhesive. Display driver integrated circuit 16 (sometimes referred to as a timing controller chip) may contain communications circuitry for communicating with system control circuitry over path 25. Path 25 may be formed from traces on a flexible printed circuit or other cable. The control circuitry may be located on a main logic board in an electronic device such as a cellular telephone, computer, set-top box, media player, portable electronic device, wrist-watch device, tablet computer, or other electronic equipment in which display 14 is being used. During operation, the control circuitry may supply display driver integrated circuit 16 with information on images to be displayed on display 14. To display the images on display pixels 22, display driver integrated circuit 16 may supply corresponding image data to data lines D while issuing clock signals and other control signals to supporting thin-film transistor display driver circuitry such as gate driver circuitry 18 and demultiplexing circuitry 20.

Gate driver circuitry 18 may be formed on substrate 24 (e.g., on the left and right edges of display 14, on only a single edge of display 14, or elsewhere in display 14). Demultiplexer circuitry 20 may be used to demultiplex data signals from display driver integrated circuit 16 onto a plurality of corresponding data lines D. With the illustrative arrangement of FIG. 1, data lines D run vertically through display 14. Each data line D is associated with a respective column of display pixels 22. Gate lines G run horizontally through display 14. Each gate line G is associated with a respective row of display pixels 22. Gate driver circuitry 18 may be located on the left side of display 14, on the right side of display 14, or on both the right and left sides of display 14, as shown in FIG. 1.

Gate driver circuitry 18 may assert gate signals (sometimes referred to as scan signals) on the gate lines G in display 14. For example, gate driver circuitry 18 may receive clock signals and other control signals from display driver integrated circuit 16 and may, in response to the received signals, assert a gate signal on gate lines G in sequence, starting with the gate line signal G in the first row of display pixels 22. As each gate line is asserted, the corresponding display pixels in the row in which the gate line is asserted will display the display data appearing on the data lines D.

Display driver circuitry 16 may be implemented using one or more integrated circuits. Display driver circuitry such as demultiplexer circuitry 20 and gate driver circuitry 18 may be implemented using one or more integrated circuits and/or thin-film transistor circuitry on substrate 24. Thin-film transistors may be used in forming circuitry in display pixels 22. To enhance display performance, thin-film transistor structures in display 14 may be used that satisfy desired criteria such as leakage current, switching speed, drive strength, uniformity, etc. The thin-film transistors in display 14 may, in general, be formed using any suitable type of thin-film transistor technology (e.g., silicon-based, semiconducting-oxide-based, etc.).

With one suitable arrangement, which is sometimes described herein as an example, the channel region (active region) in some thin-film transistors on display 14 is formed from silicon (e.g., silicon such as polysilicon deposited using a low temperature process, sometimes referred to as LTPS or low-temperature polysilicon) and the channel region in other thin-film transistors on display 14 is formed from a semiconducting oxide material (e.g., amorphous indium gallium zinc oxide, sometimes referred to as IGZO). If desired, other types of semiconductors may be used in forming the thin-film transistors such as amorphous silicon, semiconducting oxides other than IGZO, etc. In a hybrid display configuration of this type, silicon transistors (e.g., LTPS transistors) may be used where attributes such as switching speed and good reliability are desired (e.g., for drive transistors to drive current through organic light-emitting diodes in pixels), whereas oxide transistors (e.g., IGZO transistors) may be used where low leakage current is desired (e.g., as display pixel switching transistors in a display implementing a variable refresh rate scheme or other scenario in which low leakage current is require). Other considerations may also be taken into account (e.g., considerations related to power consumption, real estate consumption, hysteresis, transistor uniformity, etc.).

Oxide transistors such as IGZO thin-film transistors are generally n-channel devices (i.e., NMOS transistors), but PMOS devices may be used for oxide transistors if desired. Silicon transistors can also be fabricated using p-channel or n-channel designs (i.e., LTPS devices may be either PMOS or NMOS). Combinations of these thin-film transistor structures can provide optimum performance for an organic light-emitting diode display.

Figure 2:
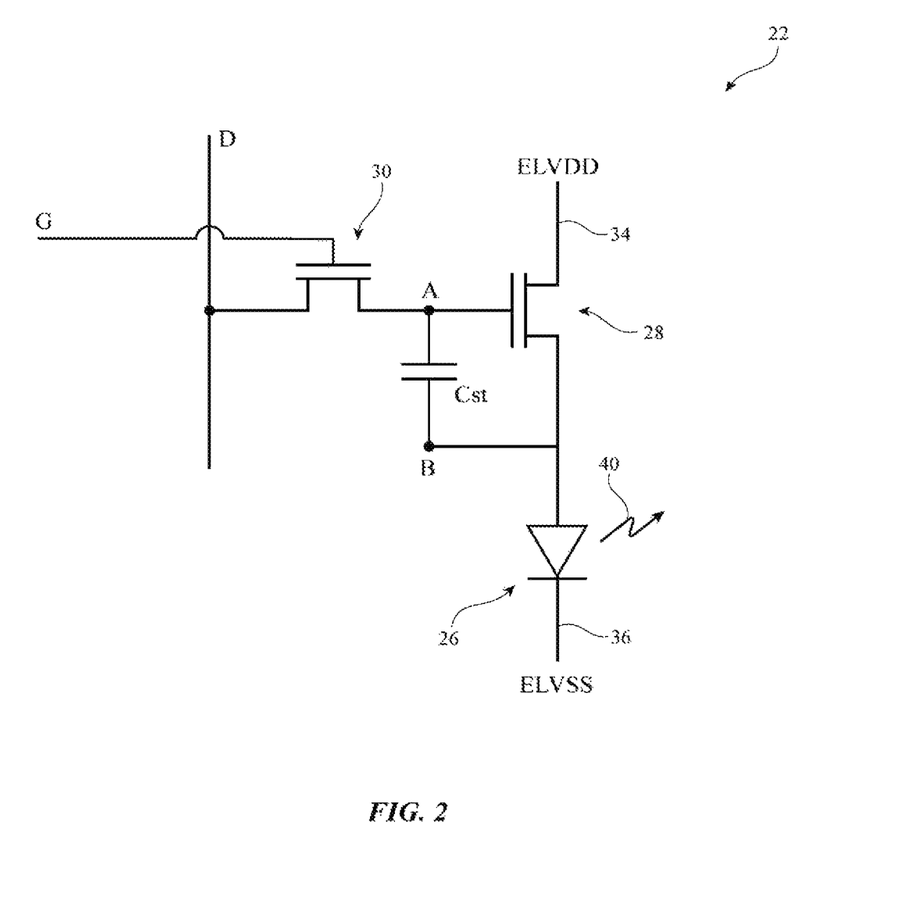
FIG. 2 is a diagram of an illustrative organic light-emitting diode display pixel of the type that may be used in an organic light-emitting diode with semiconducting oxide thin-film transistors and silicon thin-film transistors in accordance with an embodiment.

In an organic light-emitting diode display, each pixel contains a respective organic light-emitting diode. A schematic diagram of an illustrative organic light-emitting diode display pixel is shown in FIG. 2. As shown in FIG. 2, pixel 22 may include light-emitting diode 26. A positive power supply voltage ELVDD may be supplied to positive power supply terminal 34 and a ground power supply voltage ELVSS may be supplied to ground power supply terminal 36. The state of drive transistor 28 controls the amount of current flowing through diode 26 and therefore the amount of emitted light 40 from display pixel 22.

To ensure that transistor 28 is held in a desired state between successive frames of data, display pixel 22 may include a storage capacitor such as storage capacitor Cst. The voltage on storage capacitor Cst is applied to the gate of transistor 28 at node A to control transistor 28. Data can be loaded into storage capacitor Cst using one or more switching transistors such as switching transistor 30. When switching transistor 30 is off, data line D is isolated from storage capacitor Cst and the gate voltage on terminal A is equal to the data value stored in storage capacitor Cst (i.e., the data value from the previous frame of display data being displayed on display 14). When gate line G (sometimes referred to as a scan line) in the row associated with pixel 22 is asserted, switching transistor 30 will be turned on and a new data signal on data line D will be loaded into storage capacitor Cst. The new signal on capacitor Cst is applied to the gate of transistor 28 at node A, thereby adjusting the state of transistor 28 and adjusting the corresponding amount of light 40 that is emitted by light-emitting diode 26.

The illustrative pixel circuit of FIG. 2 is just one example of circuitry that may be used for the array of pixels in display 14. For example, each pixel circuit may include any suitable number of switching transistors (one or more, two or more, three or more, etc.). If desired, organic light-emitting diode display pixel 22 may have additional components (e.g., one or two emission enable transistors coupled in series with the drive transistor to help implement functions such as threshold voltage compensation, etc.). In general, the thin-film transistor structures described herein may be used with the pixel circuit of FIG. 2 or with any other suitable pixel circuits. As an example, the thin-film transistor structures described herein may be used in six-transistor pixel circuits having three switching transistor controlled by two different scan lines, a drive transistor coupled in series with an organic light-emitting diode, and two emission enable transistors controlled by two respective emission lines and coupled in series with the drive transistor and light-emitting diode to implement threshold voltage compensation functions. Thin-film transistor circuits for pixel in display 14 may also have other numbers of switching transistors (e.g., one or more, two or more, three or more, four or more, etc.) or other numbers of emission transistors (no emission transistors, one or more emission transistors, two or more emission transistors, three or more emission transistors, four or more emission transistors, etc.). The transistors in each pixel circuit may be formed from any suitable combination of silicon and silicon oxide transistors and any suitable combination of NMOS and PMOS transistors. The pixel circuitry of FIG. 2 is merely illustrative.

Figure 3:
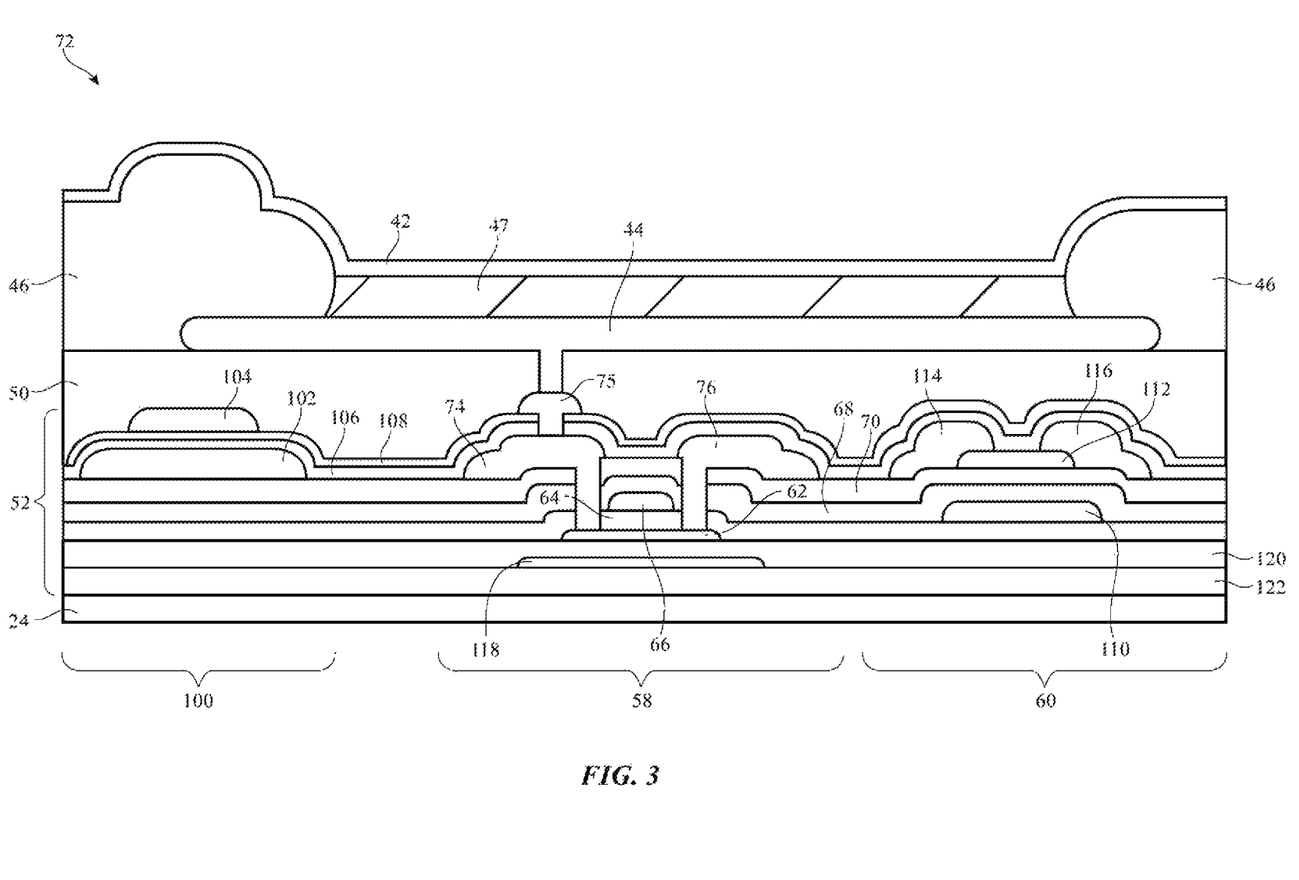
FIG. 3 is a cross-sectional side view of illustrative thin-film transistor structures for a display pixel in a configuration in which a semiconducting oxide thin-film transistor has been formed using a bottom gate arrangement in accordance with an embodiment.

Organic light-emitting diode pixels such as pixel 22 of FIG. 2 or any other suitable pixel circuits for display 14 may use thin-film transistor structures of the type shown in FIG. 3. In this type of structure, two different types of semiconductor are used. As shown in FIG. 3, pixel circuitry 72 may include pixel structures such as light-emitting diode cathode terminal 42 and light-emitting diode anode terminal 44. Organic light-emitting diode emissive material 47 may be interposed between cathode 42 and anode 44, thereby forming light-emitting diode 26 of FIG. 2. Dielectric layer 46 may serve to define the layout of the pixel (e.g., alignment of the emissive material 47 with respect to anode 44) and may sometimes be referred to as a pixel definition layer. Planarization layer 50 (e.g., a polymer layer) may be formed on top of thin-film transistor structures 52. Thin-film transistor structures 52 may be formed on substrate 24. Substrate 24 may be rigid or flexible and may be formed from glass, ceramic, crystalline material such as sapphire, polymer (e.g., a flexible layer of polyimide or a flexible sheet of other polymer material), etc.

Thin-film transistor structures 52 may include silicon transistors such as silicon transistor 58. Transistor 58 may be an LTPS transistor formed using a "top gate" design and may be used to form any of the transistors in pixel 22 (e.g., transistor 58 may serve as a drive transistor such as drive transistor 28 in pixel 22 of FIG. 2). Transistor 58 may have a polysilicon channel 62 that is covered by gate insulator layer 64 (e.g., a layer of silicon oxide or other inorganic layer). Gate 66 may be formed from patterned metal (e.g., molybdenum, as an example). Gate 66 may be covered by a layer of interlayer dielectric (e.g., silicon nitride layer 68 and silicon oxide layer 70 or other inorganic layers or organic material). Source-drain contacts 74 and 76 may contact opposing sides of polysilicon layer 62 to form the silicon thin-film transistor 58.

Gate 66 may be formed from a metal layer GATE, source-drain terminals 74 and 76 may be formed from a metal layer SD, and an additional metal layer M3 may be used to form metal via 75 to couple source-drain electrode 74 to anode 44.

Circuitry 72 may also include capacitor structures such as capacitor structure 100 (e.g., capacitor Cst of FIG. 2). Capacitor structure 100 may have a lower electrode such as electrode 102 and an upper electrode such as electrode 104. Lower electrode 102 may be formed from a patterned portion of metal layer SD. Upper electrode 104 may be formed from a patterned portion of metal layer M3. A dielectric layer may separate upper electrode 104 and lower electrode 102. The dielectric layer may be formed from a high-dielectric-constant material such as hathium oxide or aluminum oxide or may be formed from one or more other layers. In the example of FIG. 3, the dielectric layer separating electrodes 102 and 104 includes two passivation layers 106 and 108. Layers 106 and 108 may be formed from silicon oxide and silicon nitride, respectively. Other inorganic layers and/or organic layers may be used in forming layers 106 and 108, if desired (e.g., oxide layers, nitride layers, polymer layers, etc.).

Thin-film transistor structures 52 may include semiconducting oxide transistors such as semiconducting oxide transistor 60. The thin-film transistor in structures 60 may be a "bottom gate" oxide transistor. Gate 110 of transistor 60 may be formed from a portion of metal layer GATE. The semiconducting oxide channel region of transistor 60 (channel 112) may be formed from a semiconducting oxide such as IGZO. Interlayer dielectric (e.g., layers 68 and 70) may be interposed between gate 110 and semiconducting oxide channel 112 and may serve as the gate insulator layer for transistor 60. Oxide transistor 60 may have source-drain terminals 114 and 116 formed from patterned portions of metal layer SD.

Buffer layer 122 on substrate 24 may be formed from a layer of polyimide or other dielectric. Back-side metal layer 118 may be formed under transistor 58 to shield transistor 58 from charge in buffer layer 122. Buffer layer 120 may be formed over shield layer 118 and may be formed from a dielectric (e.g., an organic layer such as a polymer layer or other insulating layer).

Figure 4:
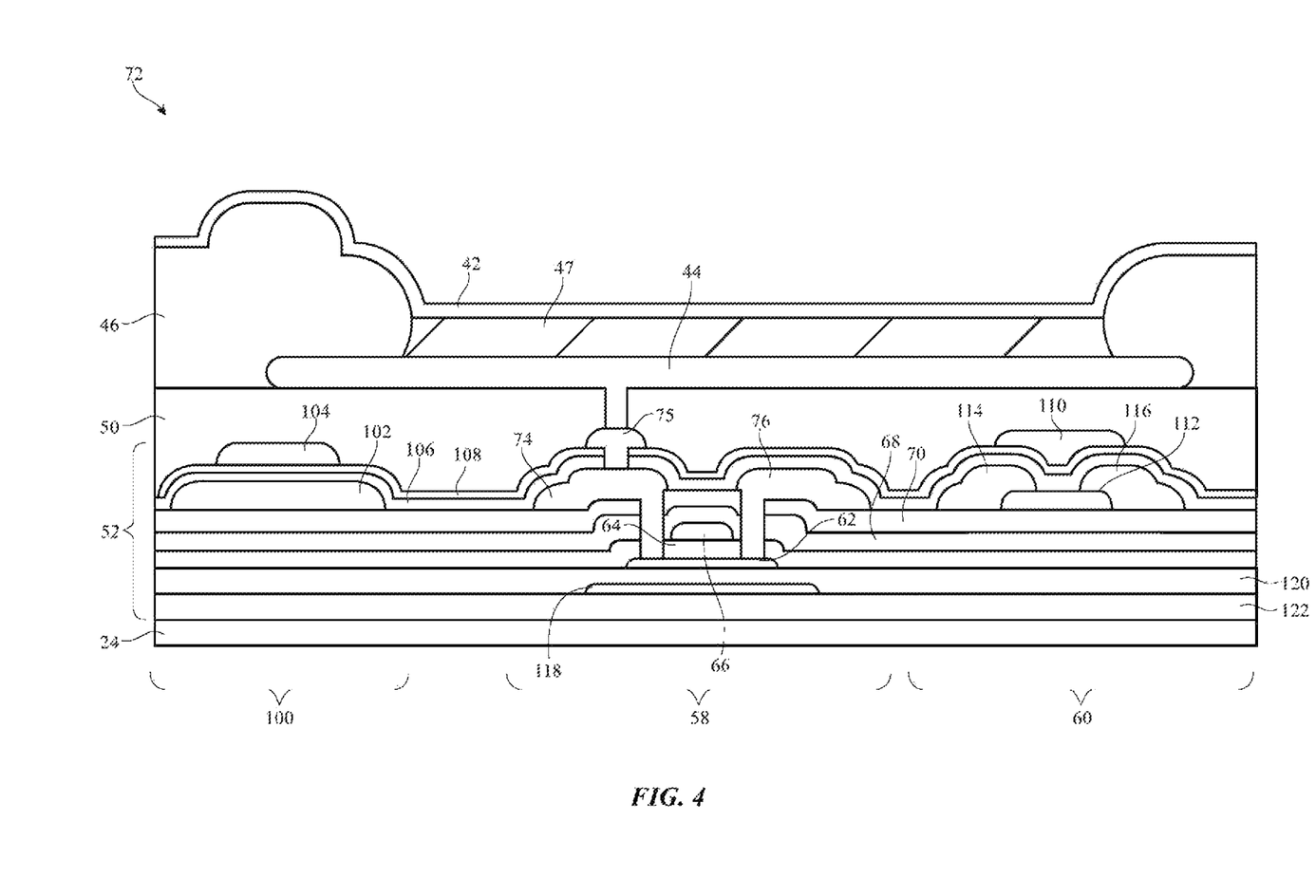
FIG. 4 is a cross-sectional side view of illustrative thin-film transistor structures for a display pixel in a configuration in which a semiconducting oxide thin-film transistor has been formed using a top gate arrangement in accordance with an embodiment.

Additional illustrative thin-film transistor circuitry 72 for pixel circuit 22 is shown in FIG. 4. In the example of FIG. 4, oxide transistor 60 has been formed using a "top gate" arrangement. With this approach, gate 110 for transistor 60 is formed from a patterned portion of metal layer M3. Metal layer M3 may also be used in forming electrode 104 of capacitor 100 (as an example). Metal layer SD may be used in forming electrode 102, source-drain terminals 74 and 76, and source-drain terminals 114 and 116. Oxide transistor 60 may have semiconducting oxide channel 112. Dielectric (e.g., passivation layers 106 and 108 and/or a high-dielectric-constant material or other insulating material) may be interposed between channel 112 and gate 110.

Figure 5:
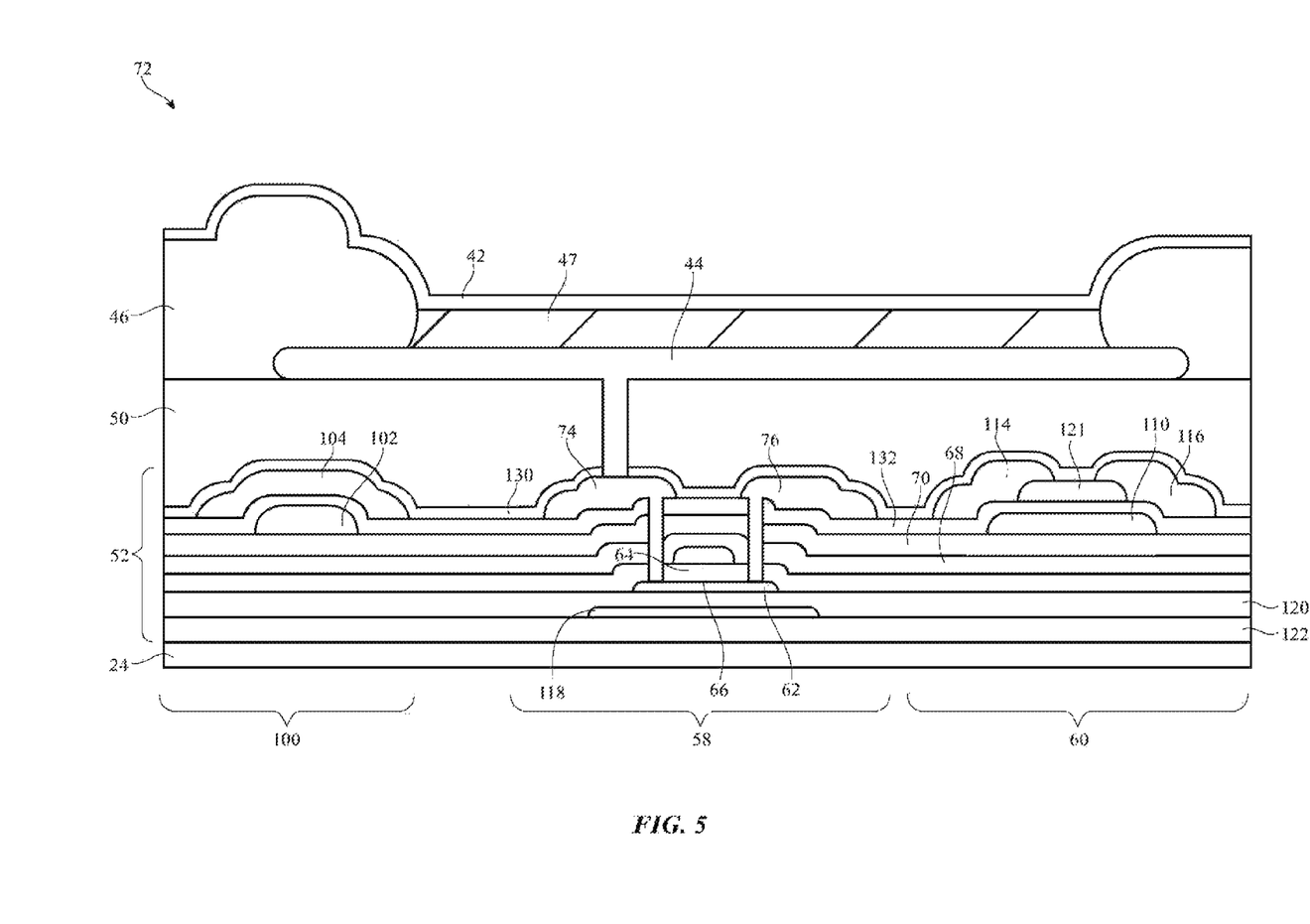
FIG. 5 is a cross-sectional side view of illustrative thin-film transistor structures for a display pixel in a configuration in which a semiconducting oxide thin-film transistor has been formed using a bottom gate arrangement and in which a storage capacitor has a first electrode patterned from the same metal layer as the gate of the semiconducting oxide thin-film transistor and a second electrode that also forms transistor source-drain electrodes in accordance with an embodiment.

In the example of FIG. 5, transistor 60 of circuitry 72 is a bottom gate oxide transistor. Dielectric layer 132 may be interposed between upper electrode 104 and lower electrode 102 of capacitor 100. Dielectric layer 132 may be formed from an inorganic insulator (e.g., silicon oxide, silicon nitride, etc.) or may be formed from a polymer layer. Layer 132 may sometimes be referred to as an interlayer dielectric layer and may be formed on top of interlayer dielectric layers 68 and 70. In capacitor 100, layer 132 separates electrodes 102 and 104 from each other. Upper electrode 104 may be formed from metal layer SD. Metal layer SD may also be used in forming source-drain electrodes 74 and 76 for silicon transistor 58 and source-drain electrodes 114 and 116 for oxide transistor 60. Lower electrode 102 may be formed a metal layer that is deposited and patterned between gate metal GATE for gate 66 and metal layer SD. The metal layer that is used in forming lower electrode 102 of FIG. 5 may sometime be referred to as metal layer M2S. In addition to being used to firm lower electrode 102 of capacitor 100, metal layer M2S may be used to form gate 110 of transistor 60.

In the configuration of FIG. 5, metal layer M2S has been formed on dielectric layers 68 and 70. Dielectric layer 132 is interposed between gate 110 and semiconducting oxide channel 121 and serves as the gate insulator for transistor 60. A passivation layer such as dielectric layer 130 may be formed over channel 121 to protect the semiconducting oxide interface of channel 121. Dielectric layer 130 and dielectric layer 132 may each be formed from silicon oxide, silicon nitride, aluminum oxide, hafnium oxide, a single layer, multiple sublayers, or other insulating materials.

Figure 6:
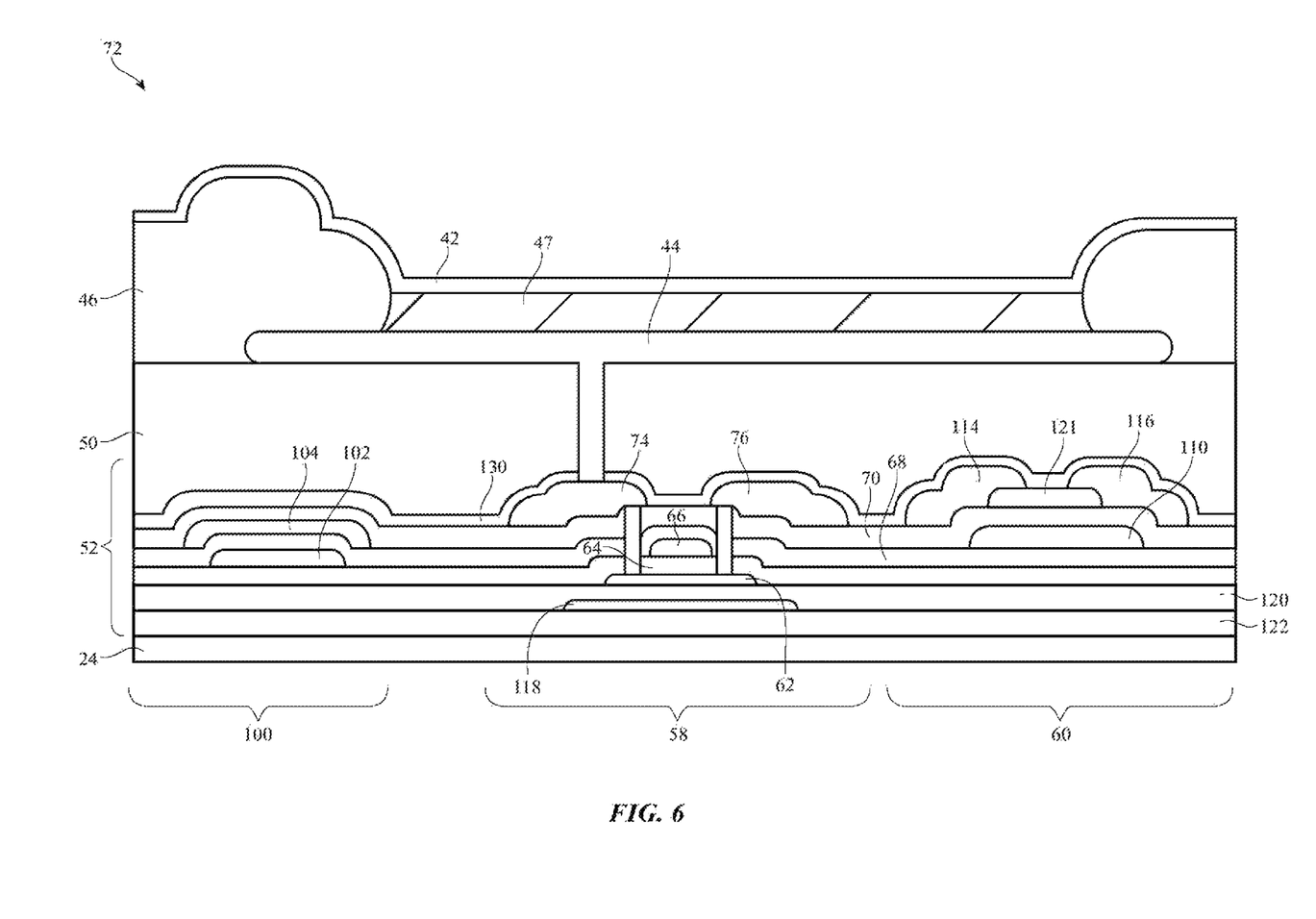
FIG. 6 is a cross-sectional side view of illustrative thin-film transistor structures for a display pixel in a configuration in which a semiconducting oxide thin-film transistor has been formed using a bottom gate arrangement and in which a storage capacitor has been formed using a lower electrode patterned from a layer of metal that also serves as a thin-film transistor gate metal in a silicon transistor in accordance with an embodiment.

FIG. 6 shows another illustrative configuration for transistor circuitry 74. In the arrangement of FIG. 6, circuitry 74 has three metal layers. Metal layer GATE is used in forming lower electrode 102 for capacitor 100 and is used in forming gate 66 for silicon transistor 58. Metal layer SD is used in forming source-drain terminals 74, 76, 114, and 116. An additional metal layer, sometimes referred to as metal layer G2, is interposed between metal layer SD and metal layer GATE. Metal layer G2 may be used in forming upper electrode 104 in capacitor 100 and may be used in forming gate 110 in oxide transistor 60. Oxide transistor 60 of FIG. 6 is a bottom gate transistor. Dielectric layer 70 serves as the gate insulator for transistor 60 and is interposed between gate 110 and semiconducting oxide channel 121. Passivation layer 130 may protect channel region 121. In capacitor 100, dielectric layer 68 is interposed between upper electrode 104 and lower electrode 102.

Figure 7:
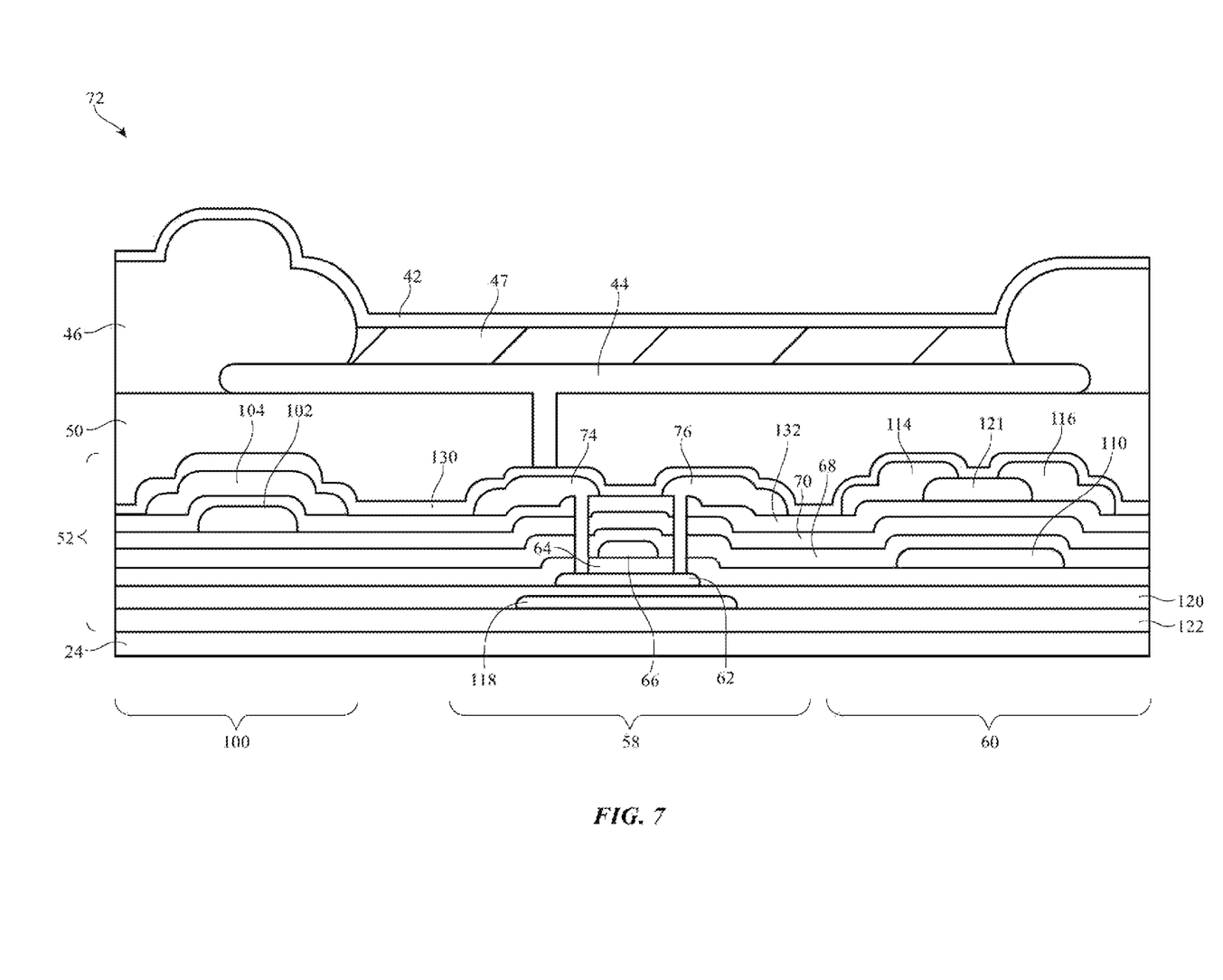
FIG. 7 is a cross-sectional side view of illustrative thin-film transistor structures for a display pixel in a configuration in which a semiconducting oxide thin-film transistor has been formed using a bottom gate arrangement having three layers of interlayer dielectric interposed between its gate and its channel in accordance with an embodiment.

In the illustrative configuration for circuitry 72 that is shown in FIG. 7, upper electrode 104 of capacitor 100 is formed from metal layer SD. Metal layer SD may also be used in forming source-drain electrodes 74 and 76 in silicon transistor 58 and source-drain electrodes 114 and 116 in oxide transistor 60. Oxide transistor 60 may have a bottom gate configuration. Gate 110 of oxide transistor 60 and gate 66 of silicon transistor 58 may be formed from respective portions of the same metal layer (i.e., metal layer GATE). An additional metal layer (metal layer M2S) may be formed between metal layer GATE and metal layer SD. Metal layer M2S may be used in forming lower electrode 102 in capacitor 100. Dielectric layer 132 may be interposed between lower electrode 102 and upper electrode 104. Passivation layer 130 may be used to protect the interface of semiconducting oxide layer 121 in oxide transistor 60.

It may be desired to minimize the inactive border region of display 14. Pixels 22 display images for a user, so the portion of display 14 that is occupied by the array of pixels 22 forms the active area of display 14. Portions of display 14 that surround the active area do not display images for a user and are therefore inactive. The amount of the inactive area that is visible to a user can be minimize or eliminated by bending portions of substrate 24 downwards out of the plane of the active area (e.g., at a right angle or at other suitable angles). To ensure that display 14 is not damaged during bending, the structures on substrate 24 can be configured to enhance flexibility of display 14 in bent portions of the inactive area. For example, insulating layers such as inorganic dielectric layers and other layers of display 14 (e.g., some of the metal layers) may be partly or completely removed in the inactive area to prevent stress-induced cracking or other damage during bending (particularly to metal signal lines).

Figure 8:
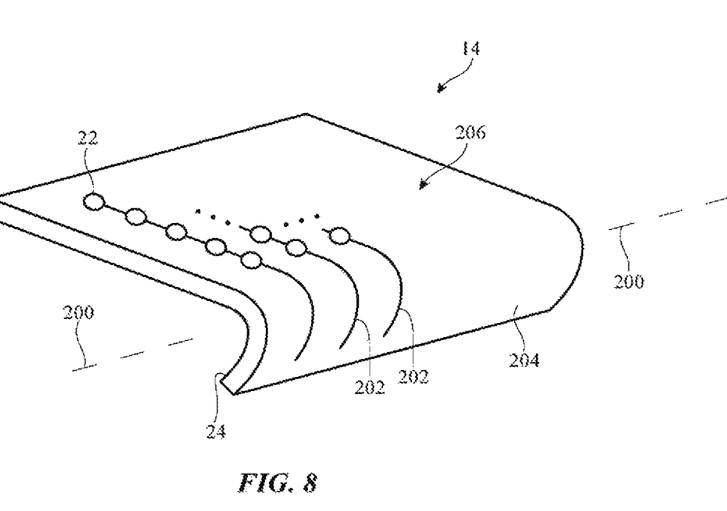
FIG. 8 is a perspective view of an illustrative display with a bent edge in accordance with an embodiment.

Consider, as an example, display 14 of FIG. 8. As shown in FIG. 8, inactive edge area 204 has been bent downwards from active area 206 about bend axis 200. Lines 202 (e.g., data lines or other metal signal traces in display 14) traverse the bend at axis 200. To prevent the formation of cracks and other damage to the structures of display 14, some or all of the structures of display 14 other than lines 202 may be selectively removed in inactive area 204 (while being retained in active area 206 to form thin-film transistor circuitry 72 such as circuitry 72 of FIGS. 3, 4, 5, 6, and 7. With this approach, the metal layer that forms lines 202 may be located at a greater distance above substrate 24 in active area 206 than in inactive area 204.

To accommodate the disparity in height between the layers of active area 206 and inactive area 204, a series of steps may be formed in the dielectric layers of display 14. The steps may slowly lower the height of the metal traces that are supported on the dielectric layers, so that the metal traces can change height gradually and do not become cut off due to a sharp height discontinuity in the dielectric.

Figure 9:
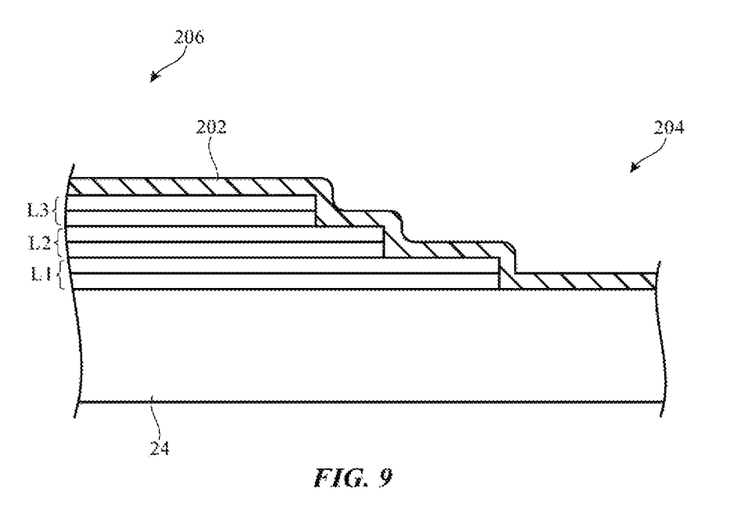
FIG. 9 is a cross-sectional side view of illustrative stepped dielectric layers for a display with a bent edge in accordance with an embodiment.

An illustrative set of dielectric layers having a stepped profile so that metal lines 202 can transition successfully between active area 206 and inactive area 204 is shown in FIG. 9. As shown in FIG. 9, display 14 may have dielectric layers such as layers L1, L2, and L3 (see, e.g., the dielectric layers of circuitry 72 in FIGS. 3, 4, 5, and 6). Layers L1, L2, and L3 may be formed from one or more sublayers of polymer and/or inorganic layers (e.g., silicon oxide, silicon nitride, hafnium oxide, aluminum oxide, etc.). There are three dielectric layers L1, L2, and L3 in the example of FIG. 9, but this is merely illustrative. On the left side of FIG. 9 in active area 206, all dielectric layers L1, L2, and L3 are present, so metal line 202 is located at its maximum distance from substrate 24. A staircase (stepped) dielectric profile is created by selectively removing layers L3, L2, and L1 at successively greater lateral distances from active area 206. The steps in height that are formed in the dielectric layers allow metal line 202 to smoothly transition from its maximum height (in active area 206) to its minimum height in inactive area 204. Line 202 may, for example, rest on or near the surface of substrate 24 in inactive area 204.

Figure 10:
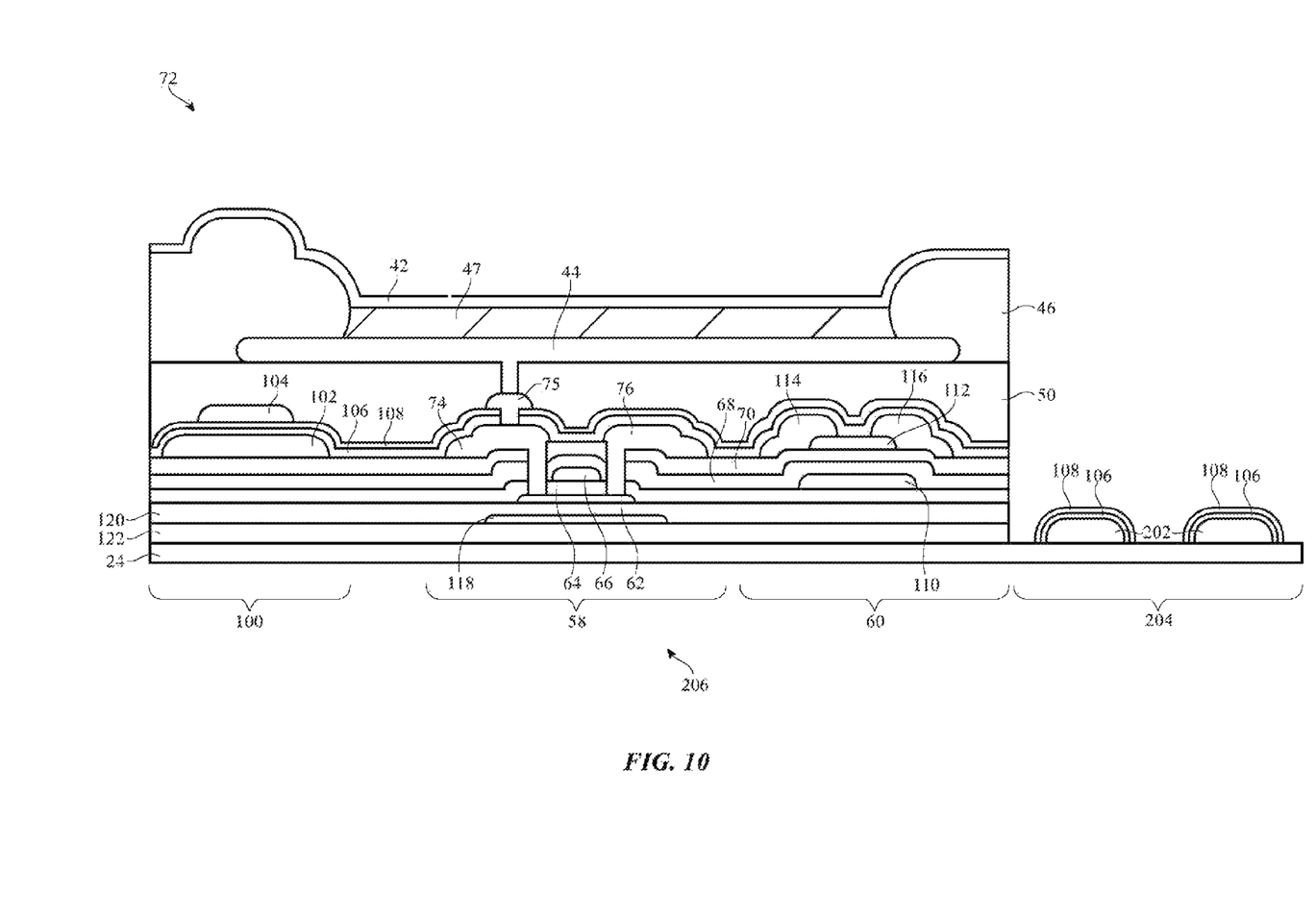
FIG. 10 is a cross-sectional side view of illustrative thin-film transistor structures for a display in a configuration in which upper layers of material have been removed from the display to facilitate display bending in an inactive area along the edge of the display in accordance with an embodiment.

FIG. 10 is a cross-sectional side view of illustrative thin-film transistor circuitry 72 for display 14 in a configuration in which upper layers of material have been removed from the display to facilitate display bending in a bend region along the inactive edge of the display. In the example of FIG. 10, all dielectric layers except passivation layers 106 and 108 have been removed from substrate 24 in region 204, so metal lines 202 (e.g., data lines and/or other signal lines in display 14) rest on the surface of substrate 24. This facilitates bending of substrate 24 in region 204. In general, any suitable thin-film transistor circuitry 72 may be used with the inactive area material removal scheme of FIG. 10 (e.g., circuitry such as circuitry 72 of FIGS. 3, 4, 5, 6, 7, and 8, etc.). The circuitry of FIG. 10 is merely illustrative.

In the illustrative configuration of FIG. 10, upper capacitor electrode 104 has been formed from metal layer M3. Metal layer M3 may also be used in forming via 74 to couple source-drain terminal 74 to anode 44. Lower capacitor electrode 102 may be formed from metal layer SD. Metal layer SD may also be used to form source-drain terminals 74, 76, 114, and 116. Passivation layers 106 and 108 (e.g., silicon nitride and silicon oxide layers, respectively) or other suitable dielectric layer(s) may be formed on top of semiconducting oxide channel 112. In capacitor 100, one of layers 106 and 108 may be locally removed to reduce dielectric thickness and thereby enhance the capacitance value of capacitor 100. As shown in FIG. 10, for example, layer 106 may be removed under electrode 104, so that layer 106 does not overlap capacitor 100 and so that only dielectric layer 108 is interposed between upper electrode 104 and lower electrode 102 of capacitor 100. Dielectric layer 108 may be formed form silicon nitride, which has a dielectric constant greater than that of silicon oxide, so the use of dielectric layer 108 as the exclusive insulating layer between electrodes 102 and 104 may help enhance the capacitance of capacitor 100. An additional photolithographic mask may be used to selectively remove silicon oxide layer 106. This mask may also be used in forming a dielectric step for metal lines 202 (see, e.g., the dielectric steps of FIG. 9). Metal lines 202 may be formed from metal layer SD. In active area 206 of display 14, metal lines 202 may be formed from portions of metal layer SD that are supported by dielectric layers such as layers 122, 120, 64, 68, and 70 (i.e., layers of the type that may form illustrative layers L1. L2, and L3 of FIG. 9). Although there are three height steps in the example of FIG. 9, one step, two steps, three steps, or more than three steps may be formed.

Figure 11:
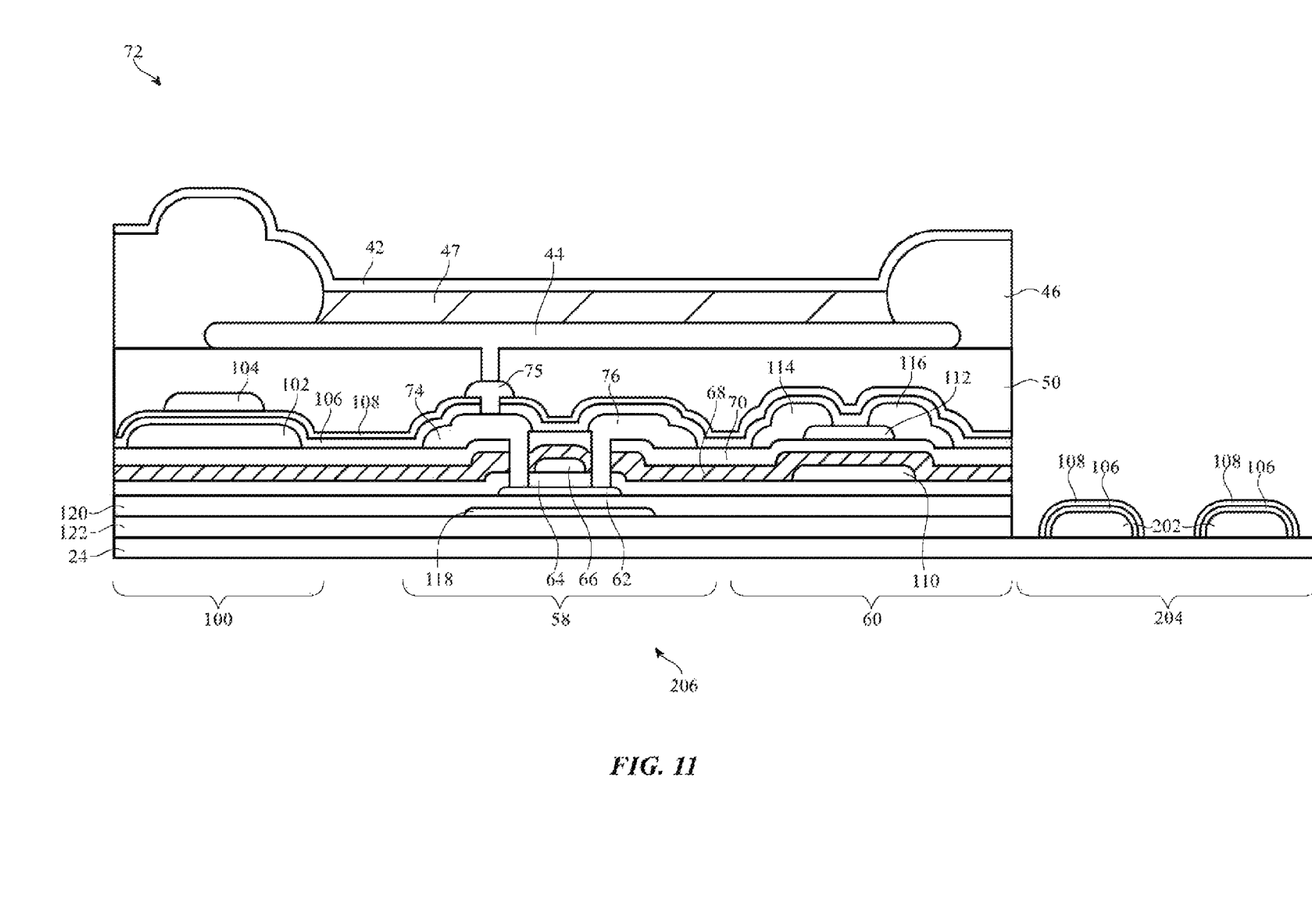
FIG. 11 is a cross-sectional side view of illustrative thin-film transistor structures for a display in a configuration in which upper layers of material have been removed from the display to facilitate display bending in a bend region along the edge of the display and in which semiconducting oxide transistor structures do not overlap any hydrogen-rich silicon nitride in accordance with an embodiment.

The illustrative configuration of FIG. 11 is similar to that of FIG. 10, but has an oxide transistor with a locally removed silicon nitride passivation layer. Passivation layer 106 of FIG. 10 may be a silicon nitride layer. Silicon nitride layer 106 may have a high concentration of hydrogen to passivate dangling bonds in polysilicon layer 62 of silicon transistor 58. For effective passivation, silicon nitride layer 106 may overlap transistor 58 and silicon channel 62. It may be desirable to prevent the hydrogen from silicon nitride layer 106 from reaching semiconducting oxide channel 112. This can be accomplished by removing nitride layer 106 from transistor 60. For example, a photolithographic mask may be used to pattern silicon nitride layer 106 so that silicon nitride layer 106 is absent under semiconducting oxide 112 (i.e., so that there is no portion of nitride layer 106 that overlaps transistor 60). By ensuring that no silicon nitride is present between gate 110 and oxide 112, the performance of transistor 60 will not be degraded due to hydrogen from layer 106.

The foregoing is merely illustrative and various modifications can be made by those skilled in the art without departing from the scope and spirit of the described embodiments. The foregoing embodiments may be implemented individually or in any combination.

What is claimed is:

1. An organic light-emitting diode display, comprising:
   a substrate;
   an array of pixel circuits that form an active area of the substrate;
   circuitry in an inactive area of the substrate;
   dielectric layers that have a first thickness in the active area, are not present in the inactive area, and have a second thickness that is less than the first thickness between the active area and the inactive area, wherein each pixel circuit comprises:
   an organic light-emitting diode;
   a silicon transistor coupled in series with the organic light-emitting diode;
   a storage capacitor coupled to the silicon transistor; and
   a semiconducting oxide transistor coupled to the storage capacitor.

2. The organic light-emitting diode display defined in claim 1 wherein the substrate is bent in the inactive area.

3. The organic light-emitting diode display defined in claim 2 wherein the silicon transistor in each pixel circuit comprises a silicon channel, wherein the dielectric layers include a buffer layer between the substrate and the silicon channel, and wherein the buffer layer is not present in the inactive area.

4. The organic light-emitting diode display defined in claim 3 further comprising a first metal layer in the active area, wherein some of the first metal layer forms a gate for the silicon transistor in each pixel circuit.

5. The organic light-emitting diode display defined in claim 4 wherein some of the first metal layer forms a gate for the semiconducting oxide transistor in each pixel circuit.

6. The organic light-emitting diode display defined in claim 4 further comprising a second metal layer, wherein the second metal layer is patterned in the active area to form source-drain terminals for the silicon transistor and for the semiconducting oxide transistor.

7. The organic light-emitting diode display defined in claim 6 wherein the second metal layer is patterned in the inactive area to form data lines that are coupled between the array of pixel circuits and the circuitry in the inactive area.

8. The organic light-emitting diode display defined in claim 7 wherein the substrate is a bent flexible substrate and wherein the data lines are bent and are formed on a surface of the substrate so that none of the dielectric layers are interposed between the data lines and the substrate.

9. The organic light-emitting diode display defined in claim 8 wherein the semiconducting oxide transistor in each pixel comprises a semiconducting oxide channel.

10. The organic light-emitting diode display defined in claim 9 wherein the dielectric layers include a silicon nitride layer that overlaps the silicon channel of the silicon transistor in each pixel circuit and that does not overlap the semiconducting oxide channel of the semiconducting oxide transistor in each pixel circuit.

11. The organic light-emitting diode display defined in claim 10, wherein the storage capacitor has a first electrode formed from the second layer of metal and has a second electrode.

12. The organic light-emitting diode display defined in claim 11 wherein the dielectric layers include an additional silicon nitride layer, wherein the additional silicon nitride layer is interposed between the first and second electrodes of the storage capacitor in each pixel circuit.

13. The organic light-emitting diode display defined in claim 12 further comprising a silicon oxide layer that overlaps the semiconducting oxide channel in each pixel circuit and that is locally removed in the storage capacitor of each pixel circuit so that none of the silicon oxide layer is interposed between the first and second electrodes of the storage capacitor.

14. The organic light-emitting diode display defined in claim 2 further comprising data lines that extend from the active area to the inactive area, wherein the dielectric layers have a stepped profile that reduces from the first height to the second height when transitioning from the active area to the inactive area, and wherein the data lines are formed on the dielectric layers with the stepped profile.

15. The organic light-emitting diode display defined in claim 1 wherein the semiconducting oxide transistor in each pixel circuit comprises a drive transistor and wherein the silicon transistor in each pixel circuit comprises a switching transistor.

16. An organic light-emitting diode display, comprising:
    a flexible polymer substrate;
    an array of pixel circuits on the substrate, each pixel circuit including an organic light-emitting diode, at least two semiconducting oxide transistors each having a semiconducting oxide channel, at least one silicon transistor coupled in series with the organic light-emitting diode, and at least one storage capacitor;
    dielectric layers on the flexible polymer substrate that have a stepped profile that reduces in height when transitioning from the array of pixel circuits to an inactive area adjacent to the array of pixel circuits; and data lines on the dielectric layers that follow the stepped profile, wherein the dielectric layers include a dielectric layer that overlaps the at least one silicon transistor and that does not overlap the semiconducting oxide channels.

* * * * *